(12) United States Patent
Lian et al.

(10) Patent No.: US 6,432,725 B1
(45) Date of Patent: Aug. 13, 2002

(54) METHODS FOR CRYSTALLIZING METALLIC OXIDE DIELECTRIC FILMS AT LOW TEMPERATURE

(75) Inventors: Jingyu Lian, Wallkill; Kwong Hon Wong, Wappingers Falls; Katherine Saenger, Ossining; Chenting Lin, Poughkeepsie, all of NY (US)

(73) Assignees: Infineon Technologies AG, Munich, NY (US); International Business Machines Corporation, Armonk (DE)

( * ) Notice: Subject to any disclaimer, the term of this patent is extended or adjusted under 35 U.S.C. 154(b) by 0 days.

(21) Appl. No.: 09/966,496

(22) Filed: Sep. 28, 2001

(51) Int. Cl.$^7$ .................. H01L 21/00; H01L 21/8242
(52) U.S. Cl. .................. 438/3; 438/104; 438/240
(58) Field of Search .................. 438/3, 104, 240, 438/243, 663

(56) References Cited

U.S. PATENT DOCUMENTS

| | | | | |
|---|---|---|---|---|
| 5,885,648 A | * | 3/1999 | Doughterty | 427/8 |
| 5,977,565 A | * | 11/1999 | Ishikawa et al. | 257/81 |
| 6,046,059 A | | 4/2000 | Shen et al. | 438/3 |
| 6,156,606 A | | 12/2000 | Michaelis | 438/243 |
| 6,165,864 A | | 12/2000 | Shen et al. | 438/396 |
| 6,194,228 B1 | * | 2/2001 | Fujiki et al. | 438/3 |
| 6,222,218 B1 | * | 4/2001 | Jammy et al. | 257/301 |
| 6,297,086 B1 | * | 10/2001 | Hedge et al. | 438/243 |
| 6,309,895 B1 | * | 10/2001 | Jaing et al. | 438/3 |
| 6,323,057 B1 | * | 11/2001 | Sone | 438/104 |
| 2001/0013660 A1 | * | 8/2001 | Duncombe et al. | 257/760 |
| 2001/0039087 A1 | * | 11/2001 | Jammy et al. | 438/243 |
| 2001/0040271 A1 | * | 11/2001 | Duncombe et al. | 257/532 |
| 2001/0046716 A1 | * | 11/2001 | Kim et al. | 438/3 |
| 2002/0001859 A1 | * | 1/2002 | Yang et al. | 438/3 |
| 2002/0006674 A1 | * | 1/2002 | Ma et al. | 438/3 |

* cited by examiner

Primary Examiner—Olik Chaudhuri
Assistant Examiner—David S Blum
(74) Attorney, Agent, or Firm—Stanton Braden

(57) ABSTRACT

A method for forming a crystalline dielectric layer deposits an amorphous metallic oxide dielectric layer on a surface. The amorphous metallic oxide dielectric layer is treated with a plasma at a temperature of less than or equal to 400 degrees Celsius to form a crystalline layer.

27 Claims, 2 Drawing Sheets

METHODS FOR CRYSTALLIZING METALLIC OXIDE DIELECTRIC FILMS AT LOW TEMPERATURE

BACKGROUND

1. Technical Field

This disclosure relates to semiconductor processing, and more particularly, to a method for crystallizing a perovskite layer, such as, barium strontium titanium oxide (BSTO), by employing a low temperature process.

2. Description of the Related Art

To be employed as a high dielectric material in semiconductor devices, such as dynamic random access memories (DRAMs), barium strontium titanium oxide (BSTO) films need to be crystallized. The high crystallization temperature of BSTO creates difficulties for integrating BSTO into current semiconductor fabrication processes. Current, BSTO processing includes:

1. Depositing BSTO at high temperature to form crystallized films, as deposited, 450° C.–500° C. for sputtering and 580° C.–640° C. for metal oxide chemical vapor deposition (MOCVD); or
2. Annealing the amorphous films deposited at low temperature by annealing at high temperatures (e.g., 600° C. or higher.

In most deposition methods, the higher the deposition temperature the better crystalline quality of the film. However, in DRAMs with stacked capacitors, problems occur at high temperatures. For example, oxidation of barrier layers formed to prevent diffusion of metals occurs. Oxidation due to high temperature and the oxygen ambient environment cause an increase in contact resistance for electrical components.

Therefore, a need exists for a method for crystallizing perovskite materials at low temperatures to avoid excessive oxidation and provide a high dielectric constant film.

SUMMARY OF THE INVENTION

A method for forming a crystalline dielectric layer deposits an amorphous metallic oxide dielectric layer on a surface. The amorphous metallic oxide dielectric layer is treated with a plasma at a temperature of less than or equal to 400 degrees Celsius to form a crystalline layer.

In other methods, the step of depositing an amorphous metallic oxide dielectric layer on a surface may include the step of depositing the amorphous metallic oxide dielectric layer at a temperature of less than or equal to about 450 degrees Celsius.

The amorphous metallic oxide dielectric layer may include a titanium oxide, such as, barium strontium titanium oxide or other perovskite dielectric. The step of treating may include treating the metallic oxide dielectric layer with a plasma including at least one of nitrogen and oxygen. The plasma is preferably maintained at a pressure of between about 1 mTorr and 5 Torr.

In still other methods, the step of treating may include treating the amorphous metallic oxide dielectric layer with a plasma for less than one minute. The step of depositing metallic oxide dielectric material on the crystalline layer to form a thicker crystalline layer may be included. The crystalline layer preferably provides a non-zero x-ray diffraction intensity from a <111> surface. The crystalline layer may be employed as a capacitor dielectric in semiconductor devices, such as DRAMs.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides methods for crystallizing dielectric layers, which include an oxide of a metal. The present invention provides a process by which an amorphous film of the dielectric is deposited and then treated with a plasma to crystallize the dielectric. This process has the advantage of reducing unwanted oxidations and increases the dielectric properties of the film. In one embodiment, by employing a plasma treatment, an amorphous BSTO film can be crystallized at a much lower temperature and in a shorter process time as compared to conventional annealing processes temperature. The plasma temperatures employed by the present invention are also lower than crystal forming chemical vapor deposition (CVD) processes. The present invention will be illustratively described in terms of BSTO films; however, the present invention is applicable to any metallic oxide films, which include a crystalline form.

Figure 1:
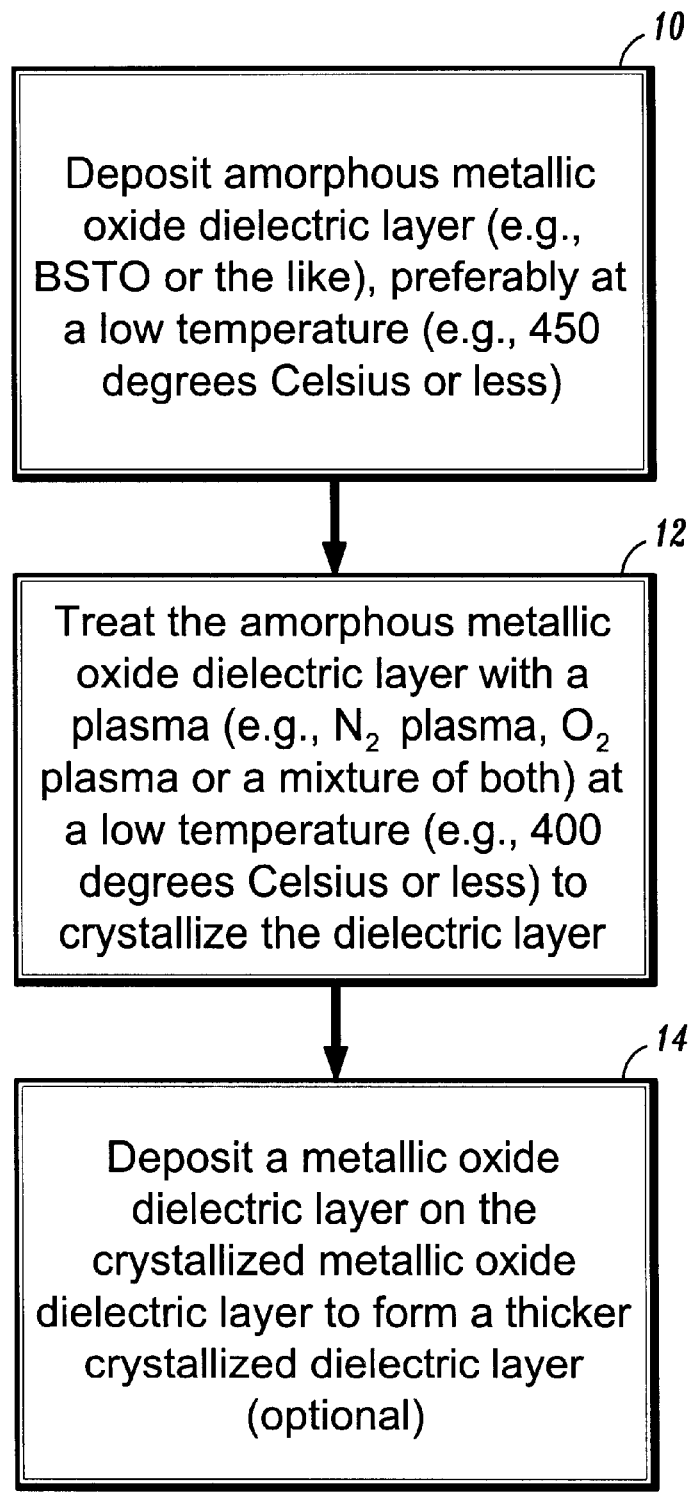
FIG. 1 is a block diagram showing a method for forming a low temperature crystalline dielectric layer form an amorphous metallic oxide dielectric layer in accordance with the present invention.

Referring now in specific detail to the drawings in which like reference numerals identify similar or identical elements throughout the several views, and initially to FIG. 1, a flow diagram shows an illustrative method for crystallizing a dielectric layer in accordance with the present invention. In block an amorphous metallic oxide dielectric layer is formed. Amorphous metallic oxide may include barium strontium titanium oxide (BSTO), strontium titanium oxide (STO), titanium oxide ($TiO_2$), barium titanium oxide (BTO), lead titanium oxide, lead zirconium titanium oxide, dielectrics with perovskite structures or other metallic oxide dielectrics, preferably titanium oxides, capable of forming a crystalline structure. In one embodiment, amorphous metallic oxide includes an amorphous BSTO film. The amorphous BSTO film may be formed by a performing a low temperature preferably below about 400° C., however temperatures as high as about 520° C. may be employed. Other processes may be employed to form the amorphous BSTO film; however, low temperature processes are preferred (e.g., 450° C. or lower).

In block 12, a plasma treatment is performed in accordance with the present invention. A semiconductor device or substrate including an amorphous BSTO (or other metallic oxide dielectric layer) is placed in a plasma reactor or a remote plasma reactor (e.g., plasma carried from another chamber). The plasma treatment includes generating an oxygen plasma, a nitrogen plasma, or a mixture of oxygen and nitrogen plasmas in the plasma chamber and treating the BSTO film with the plasma. Bias power employed during the plasma treatment is preferably between about 500 Watts and 1200 Watts, more preferably about 750 Watts. Plasma is preferably controlled by the pressure in the chamber. Pressure is preferably maintained in the range or about 1 mTorr to about 5 Torr, and more preferably about 1.3 Torr.

The plasma treatment is performed at low temperatures, preferably about 400° C. or lower (e.g., down to around 200° C.) for short durations of time, e.g., under one minute and preferably less than 30 seconds. In one example, at a plasma treatment temperature of about 400° C., a 35 second duration was needed to crystallize the BSTO film. Advantageously, the present invention employs significantly lower temperatures at significantly shorter durations to crystallize the amorphous BSTO film. For example, the plasma treatment method of the present invention (400° C. or lower, 35 seconds or shorter) can be compared to the conventional annealing of an amorphous film with anneal temperatures of 600° C. or higher for 15 minutes or longer. The present invention substantially reduces the time and temperature needed to crystallize a BSTO (or other metallic oxide) film. By reducing temperature and duration, other components of the semiconductor device structure are less likely to react with ambient gases or plasmas. This results in significant decreases in undesirable oxidation, for example. Contact resistance and other performance characteristics of a semiconductor device employing the BSTO are improved as a result.

BSTO films may be employed in a wide variety of applications. In one embodiment of the present invention, BSTO films are employed in a semiconductor memory device as a capacitor dielectric material in for example, stacked capacitors. Semiconductor memories, for example, dynamic random access memories (DRAMs) with a memory density of 1 G or higher preferably include metallic oxide dielectric layer which are crystallized to provide a high dielectric layer for capacitors, etc. Because BSTO films have a perovskite structure, a high dielectric constant is achieved by crystallization. High dielectric constants provide higher capacitance while consuming the same or less space. Crystallization to achieve a high dielectric constant may be more important in certain crystallographic planes. In particular, high dielectric properties are achieved if a crystalline form exists in the <111> plane.

Figure 2:
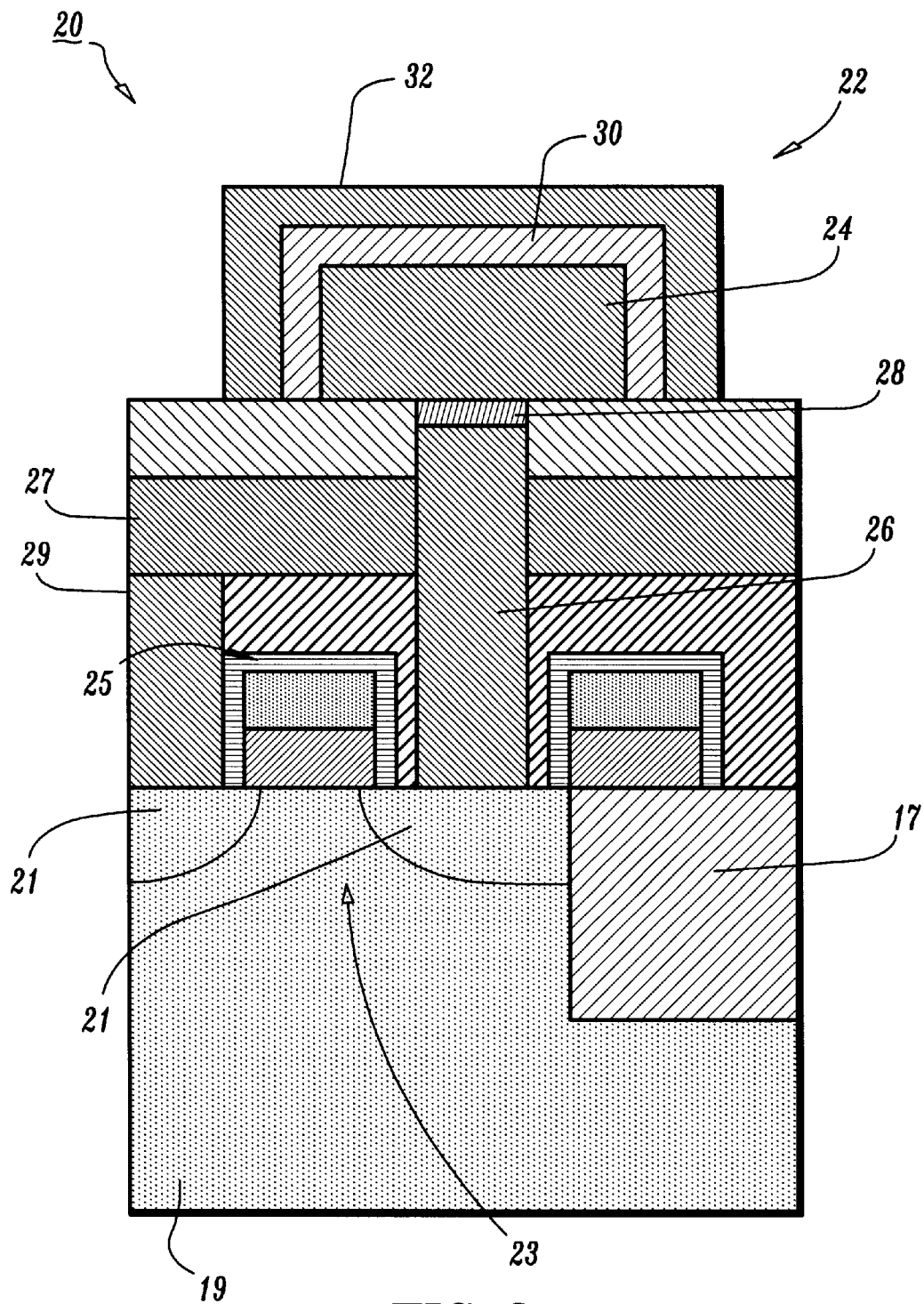
FIG. 2 is a cross-sectional view of a semiconductor device structure showing a crystalline metallic oxide dielectric layer employed as a capacitor dielectric in accordance with the present invention.

Referring to FIG. 2, a structure of a stacked capacitor 22 is shown for a semiconductor device 20. Semiconductor device 22, may include a DRAM device, embedded DRAM device, a processor or any other semiconductor device which employs high dielectric films. Stacked capacitor 22 includes a lower electrode 24, which connects to a plug 26 through a barrier layer 28. Plug 26 connects to a diffusion region 21 formed in a substrate 19. Diffusion region 21 is part of an access transistor 23, which is employed to charge or discharge capacitor 22 in accordance with the activation of a wordline 25 (gate of transistor 23) and data on a bitline 27. Bitline 27 connects to a diffusion region 21 of transistor 23 by a bitline contact 29. A shallow trench isolation region (STI) 17 is shown as is known in the art.

Plug 26 includes a conductive material, such as, polysilicon, and barrier layer 28 include materials, such as, for example, TaN, TaSiN, TiN or equivalents, to reduce diffusion between lower electrode 24 and plug 26. Lower electrode 24 preferably includes a noble metal, such as platinum, ruthenium, and/or noble metal oxides such as ruthenium oxide. An amorphous metallic oxide dielectric film is deposited at a low temperature and plasma treated in accordance with the present invention to crystallize a capacitor dielectric layer 30. Since layer 30 is deposited and treated at low temperatures for short durations, oxidation of barrier layer 28 and plug 26 due to ambient conditions is reduced.

Oxidation occurs with conventional processes at barrier layer 28 and plug 26. This is substantially reduced by the present invention since mass transport mechanisms, such as diffusion are reduced by reducing the concentration, temperature and availability (duration) of oxygen.

In most conventional deposition methods, the higher the deposition temperature the better crystalline quality of the film. However, oxidation of barrier layers and increased contact resistance are experienced, and the oxygen ambient therefore limits the deposition temperature. In contrast with the conventional methods, the present invention employs a plasma treatment at low temperatures, e.g., 400° C. or less, for short durations, e.g., 35 second or less, to achieve a crystalline dielectric film of at least the same quality as the conventional methods. Since less oxidation occurs, decreased barrier layer 28 thicknesses are needed.

Stacked capacitor 22 is completed by forming an upper electrode 32. Processing continues as is known in the art. It is to be understood that the present invention should not be construed as limited by the structure shown in FIG. 2. Instead, the present invention is broader as may be employed with other capacitor structures, or any other semiconductor device structure, which needs high dielectric constant materials.

Referring again to FIG. 1, an optional step, in block 14, includes employing the crystalline metallic oxide dielectric film (BSTO) as a nucleation layer or a seed layer to grow a thicker film having a crystal structure. Since a thin layer (e.g., less than about 5 nm) may be deposited initially as an amorphous layer, after crystallization, thicker layers (e.g., 5–100 nm) can be grown to increase dielectric protection using the amorphous deposition process at low temperatures.

Scanning electron microscope (SEM) images and X-ray diffraction (XRD) intensity measurements, made by the inventors, have confirmed the crystalline nature of the deposited films treated with plasma in accordance with the present invention. Table 1 shows the results of XRD intensity measurements of: 1) a conventional as-deposited crystalline BSTO film (at a deposition temperature of 520° C., and approximately 300 angstroms thick), 2) a conventional amorphous BSTO film annealed at a temperature of 650° C. for 15 minutes, and 3) a plasma treated layer at 400° C. for 35seconds in accordance with the present invention. X-ray diffraction intensities were measured for each of the crystallographic planes listed in table. 1. Note, that the present invention provide a strong intensity in the <111> plane which is more important for dielectric properties than the other crystal planes.

TABLE 1

XRD Intensity for crystallographic planes.

| BSTO Film | <100> | <110> | <111> | <200> |
|---|---|---|---|---|
| 1) as-deposited crystalline | 0 | 0 | 0 | 0 |
| 2) Annealed | 160 | 40 | 0 | 480 |
| 3) Plasma treated (present invention) | 70 | 0 | 230 | 160 |

Having described preferred embodiments for methods for crystallizing metallic oxide dielectric films at low temperature (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for forming a crystalline dielectric layer, comprising the steps of:
    depositing an amorphous metallic oxide dielectric layer on a surface; and
    treating the amorphous metallic oxide dielectric layer with a plasma at a temperature of less than or equal to 400 degrees Celsius to form a crystalline layer.

2. The method as recited in claim 1, wherein the step of depositing an amorphous metallic oxide dielectric layer on a surface includes the step of depositing the amorphous metallic oxide dielectric layer at a temperature of less than or equal to about 450 degrees Celsius.

3. The method as recited in claim 1, wherein the amorphous metallic oxide dielectric layer includes barium strontium titanium oxide.

4. The method as recited in claim 1, wherein the amorphous metallic oxide dielectric layer includes a titanium oxide.

5. The method as recited in claim 1, wherein the amorphous metallic oxide dielectric layer includes a perovskite dielectric.

6. The method as recited in claim 1, wherein the step of treating includes treating the metallic oxide dielectric layer with a plasma including at least one of nitrogen and oxygen.

7. The method as recited in claim 6, wherein the plasma is maintained at a pressure of between about 1 mTorr and 5 Torr.

8. The method as recited in claim 1, wherein the step of treating includes treating the amorphous metallic oxide dielectric layer with a plasma for less than one minute.

9. The method as recited in claim 1, further comprising the step of depositing metallic oxide dielectric material on the crystalline layer to form a thicker crystalline layer.

10. The method as recited in claim 1, wherein the crystalline layer provides a non-zero x-ray diffraction intensity from a <111> surface.

11. A method for forming a crystalline dielectric layer, comprising the steps of:
    depositing an amorphous titanium oxide layer on a surface; and
    treating the titanium oxide layer with a plasma at a temperature of less than or equal to 400 degrees Celsius for a duration of less than one minute to form a crystalline barium strontium titanium oxide layer.

12. The method as recited in claim 11, wherein the step of depositing an amorphous titanium oxide layer on a surface includes the step of depositing a barium strontium titanium oxide layer at a temperature of less than or equal to about 450 degrees Celsius.

13. The method as recited in claim 11, wherein the step of treating includes treating the titanium oxide layer with a plasma including at least one of nitrogen and oxygen.

14. The method as recited in claim 13, wherein the plasma is maintained at a pressure of between about 1 mTorr and 5 Torr.

15. The method as recited in claim 13, wherein the step of treating includes treating the amorphous titanium oxide layer with a plasma for less than 30 seconds.

16. The method as recited in claim 11, further comprising the step of depositing titanium oxide on the crystalline layer to form a thicker crystalline layer.

17. The method as recited in claim 11, wherein the crystalline layer provides a non-zero x-ray diffraction intensity from a <111> surface.

18. A method for forming a crystalline dielectric layer, comprising the steps of:
    depositing an amorphous metallic oxide dielectric layer on a first electrode of a capacitor; and
    treating the amorphous metallic oxide dielectric layer with a plasma at a temperature of less than or equal to 400 degrees Celsius to form a crystallized capacitor dielectric layer.

19. The method as recited in claim 18, wherein the step of depositing an amorphous metallic oxide dielectric layer includes the step of depositing the amorphous metallic oxide dielectric layer at a temperature of less than or equal to about 450degrees Celsius.

20. The method as recited in claim 18, wherein the amorphous metallic oxide dielectric layer includes at least one of barium strontium titanium oxide, lead titanium oxide, lead zirconium titanium oxide, titanium oxide, barium titanium oxide and strontium titanium oxide.

21. The method as recited in claim 18, wherein the amorphous metallic oxide dielectric layer includes a perovskite dielectric.

22. The method as recited in claim 18, wherein the step of treating includes treating the metallic oxide dielectric layer with a plasma including at least one of nitrogen and oxygen.

23. The method as recited in claim 22, wherein the plasma is maintained at a pressure of between about 1 mTorr and 5 Torr.

24. The method as recited in claim 18, wherein the step of treating includes treating the amorphous metallic oxide dielectric layer with a plasma for less than one minute.

25. The method as recited in claim 18, further comprising the step of depositing metallic oxide dielectric material on the crystallized capacitor dielectric layer to form a thicker crystallized capacitor dielectric layer.

26. The method as recited in claim 18, further comprising the step of depositing an upper electrode on the crystallized capacitor dielectric layer to form a stacked capacitor.

27. The method as recited in claim 18, wherein the crystalline layer provides a non-zero x-ray diffraction intensity from a <111> surface.

* * * * *